United States Patent
Okita et al.

(10) Patent No.: US 9,799,495 B2
(45) Date of Patent: Oct. 24, 2017

(54) PLASMA PROCESSING APPARATUS AND PLASMA PROCESSING METHOD

(71) Applicant: PANASONIC INTELLECTUAL PROPERTY MANAGEMENT CO., LTD., Osaka (JP)

(72) Inventors: Shogo Okita, Hyogo (JP); Bunji Miizuno, Nara (JP); Tomohiro Okumura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/834,992

(22) Filed: Aug. 25, 2015

(65) Prior Publication Data
US 2016/0064198 A1 Mar. 3, 2016

(30) Foreign Application Priority Data

Sep. 2, 2014 (JP) .................................. 2014-178085

(51) Int. Cl.
*H01J 37/32* (2006.01)
*H01L 21/67* (2006.01)
*H01L 21/683* (2006.01)
*H01L 21/687* (2006.01)

(52) U.S. Cl.
CPC ...... *H01J 37/32724* (2013.01); *H01J 37/321* (2013.01); *H01J 37/32651* (2013.01); *H01J 37/32697* (2013.01); *H01L 21/67092* (2013.01); *H01L 21/67109* (2013.01); *H01L 21/6831* (2013.01); *H01L 21/68728* (2013.01); *H01L 21/68742* (2013.01)

(58) Field of Classification Search
None
See application file for complete search history.

(56) References Cited

U.S. PATENT DOCUMENTS 4,887,283 A * 12/1989 Hosono .................... G03F 1/22
378/35
5,298,465 A * 3/1994 Levy .................. H01J 37/3244
118/50.1

(Continued)

FOREIGN PATENT DOCUMENTS

JP 2009-094436 A 4/2009

*Primary Examiner* — Allan Olsen
(74) *Attorney, Agent, or Firm* — Pearne & Gordon LLP

(57) ABSTRACT

A plasma processing apparatus that performs plasma processing on a substrate held on a transport carrier including an annular frame and a holding sheet. The apparatus includes a process chamber; a process gas supply unit that supplies process gas to the process chamber; a decompressing mechanism that decompresses the process chamber; a plasma excitation device that generates plasma in the process chamber; a stage in the chamber, on which the transport carrier is loaded; a cooling mechanism for cooling the stage; a cover that partly covers the holding sheet and the frame and that has a window section through which the substrate is partly exposed to plasma; a correction member that presses the frame onto the stage and corrects warpage of the frame; and a movement device that moves the correction member. The correction member is provided separately from the cover to be covered by the cover.

9 Claims, 11 Drawing Sheets

(56) References Cited

U.S. PATENT DOCUMENTS

| | | | | |
|---|---|---|---|---|
| 6,074,488 | A * | 6/2000 | Roderick | H01L 21/6833 118/723 E |
| 7,501,161 | B2 * | 3/2009 | Hou | C23C 16/4585 118/728 |
| 7,837,825 | B2 * | 11/2010 | Fischer | H01J 37/32623 118/723 E |
| 8,691,702 | B2 * | 4/2014 | Geerpuram | H01J 37/32495 257/E21.599 |
| 2010/0216313 | A1 | 8/2010 | Iwai | |
| 2013/0230974 | A1 * | 9/2013 | Martinez | H01L 21/68771 438/464 |
| 2014/0072774 | A1 * | 3/2014 | Kito | H01L 21/67092 428/174 |
| 2015/0122776 | A1 * | 5/2015 | Okita | H01L 21/6831 216/67 |
| 2016/0064188 | A1 * | 3/2016 | Okita | H01J 37/32715 156/345.24 |
| 2016/0064196 | A1 * | 3/2016 | Okita | H01J 37/32651 216/58 |
| 2016/0086838 | A1 * | 3/2016 | Santos Rodriguez | H01L 21/304 206/710 |

* cited by examiner

PLASMA PROCESSING APPARATUS AND PLASMA PROCESSING METHOD

CROSS-REFERENCES TO RELATED APPLICATION(S)

This application is based on and claims priority from Japanese Patent Application No. 2014-178085 filed on Sep. 2, 2014, the entire contents of which are incorporated herein by reference.

BACKGROUND

1. Field of the Invention

One or more embodiments of the present invention relate to a plasma processing apparatus and a plasma processing method for performing plasma processing on a substrate held on a transport carrier that has an annular frame and a holding sheet.

2. Description of Related Art

In a plasma processing apparatus having a substrate as a processing target, which is held on a transport carrier that has an annular frame and a holding sheet, it is necessary to prevent thermal damage to the frame and the holding sheet due to plasma. This is because a defect such as expansion (deformation) of the holding sheet is caused when the holding sheet containing a resin material is heated. Patent Document 1 proposes that the frame and the holding sheet are covered with a donut-shaped cover having a window section at the center. In this manner, the frame and the holding sheet are covered from plasma. Meanwhile, plasma processing is performed on the substrate exposed through the window section.

Patent Document 1 is JP-A-2009-94436.

SUMMARY

A transport carrier holding a substrate is conveyed into a chamber provided in a plasma processing apparatus and is loaded on a stage provided in the chamber. Normally, a cooling mechanism is provided on the stage such that thermal damage to the transport carrier due to plasma is prevented.

The transport carrier that has an annular frame and a holding sheet is used not only in a case of performing the plasma processing but also in a case where a substrate is processed using a related-art dicing method with a blade or laser. The related-art dicing method is performed in an environment where there is no need to consider heat due to the plasma and warpage of the frame is mechanically corrected. Thus, the warpage of the frame should never be a problem.

One or more embodiments of the present invention aim at enhancing process stability in a case where the plasma processing is performed on a substrate held on a transport carrier that has an annular frame and a holding sheet. That is, according to one aspect of the embodiments of the present invention, there is provided a plasma processing apparatus that performs plasma processing on a substrate held on a transport carrier which has an annular frame and a holding sheet, the plasma processing apparatus including: a chamber that has a process chamber configured to be decompressed; a process gas supply unit that supplies process gas to the process chamber; a decompressing mechanism that decompresses the process chamber; a plasma excitation device that generates plasma in the process chamber; a stage in the chamber, on which the transport carrier is loaded; a cooling mechanism configured to cool the stage; a cover that covers a part of the holding sheet and at least a part of the frame of the transport carrier loaded on the stage and that has a window section through which at least a part of the substrate is exposed to plasma; a correction member that presses the frame of the transport carrier loaded on the stage onto the stage and corrects warpage of the frame; and a movement device that moves a relative position of the correction member with respect to the frame, wherein the correction member is provided separately from the cover to be covered by the cover.

According to another aspect of the present invention, there is provided a plasma processing method of performing plasma processing on a substrate held on a transport carrier that has an annular frame and a holding sheet, the plasma processing method including: (i) conveying the transport carrier holding the substrate into a chamber provided in a plasma processing apparatus and loading the transport carrier on the stage that is equipped with a cooling mechanism and provided in the chamber; (ii) covering a part of the holding sheet and at least a part of the frame of the transport carrier loaded on the stage, with a cover that has a window section through which at least a part of the substrate is exposed to plasma; (iii) pressing the frame of the transport carrier loaded on the stage onto the stage and correcting warpage of the frame by a correction member that is provided separately from the cover to be covered by the cover; and (iv) generating plasma in the chamber and performing the plasma processing on the substrate through the window section.

According to the embodiments of the present invention, it is possible to suppress abnormal discharge due to warpage of an annular frame or insufficient cooling of a transport carrier. Accordingly, process stability of plasma processing is enhanced.

DETAILED DESCRIPTION

Next, embodiments of the present invention will be described with reference to the drawings. However, the technical scope of the present invention is not limited to the following description.

First Embodiment

Figure 1:
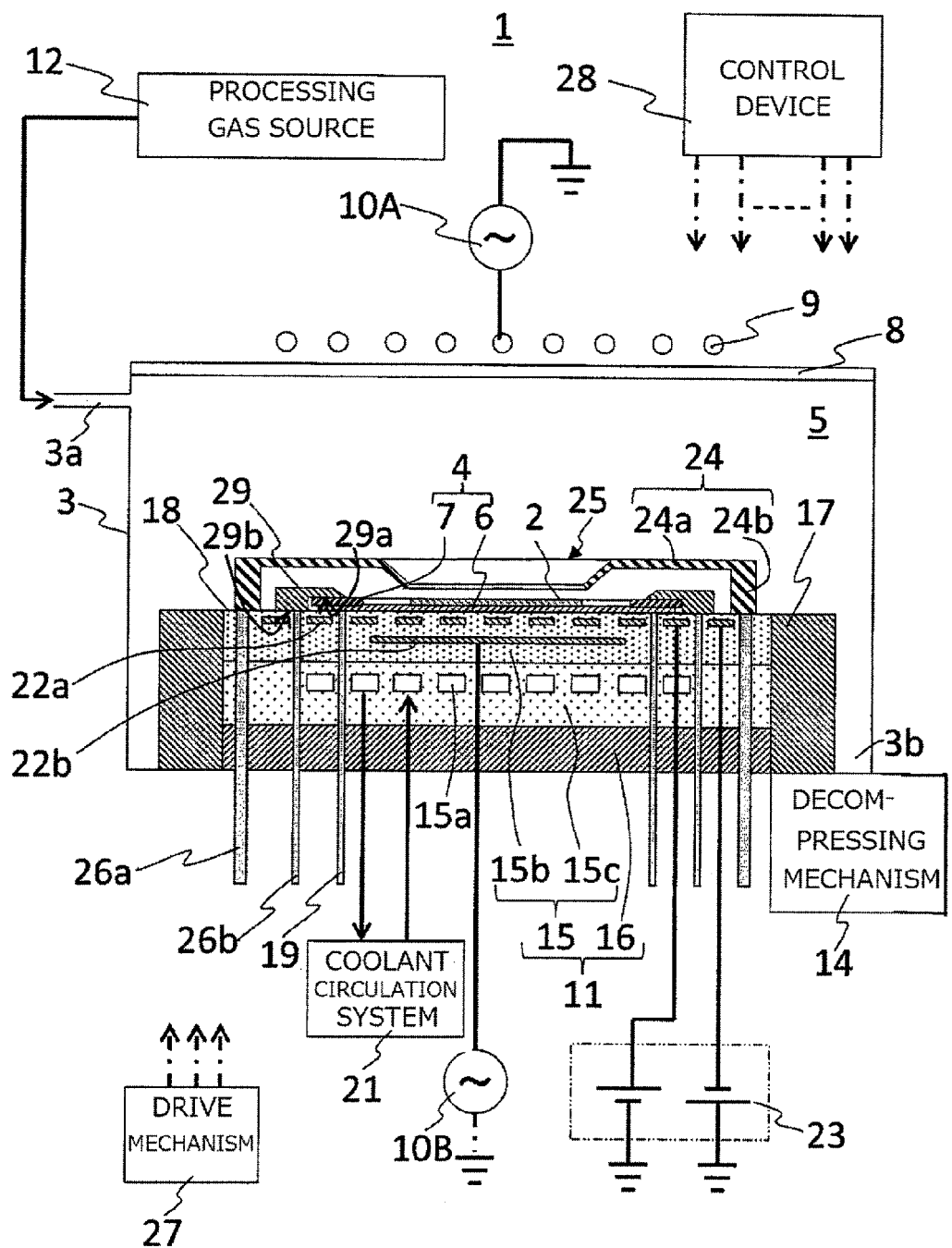
FIG. 1 is a sectional view conceptually showing a first state of a plasma processing apparatus according to a first embodiment of the present invention.

FIG. 1 is a sectional view conceptually showing a structure of a dry etching apparatus 1 which is a plasma processing apparatus according to a first embodiment of the present invention.

The dry etching apparatus 1 performs plasma dicing as plasma processing on a substrate 2 held on a transport carrier 4 that includes an annular frame 7 and a holding sheet 6. The plasma dicing is a method in which the substrate 2 such as a silicon wafer in which a plurality of integration circuits (IC) are formed is cut along a border line (slit) through dry etching and a plurality of individual ICs are formed.

The dry etching apparatus 1 includes a chamber (vacuum vessel) 3 which has a process chamber 5 which can be decompressed. The transport carrier 4 holding the substrate 2 is conveyed into the process chamber 5 from an openable/closable entrance (not shown) of the chamber 3.

A gas needed for generating plasma is supplied from a processing gas source 12 through piping to a gas guiding port 3a of the chamber 3. That is, the processing gas source 12 and the piping constitute at least a part of a process gas supply unit. The chamber 3 has an outlet 3b for gas emission from and decompression of the process chamber 5. The outlet 3b is connected to a decompressing mechanism 14 that includes a vacuum pump.

An upper electrode (antenna) 9 that constitutes a plasma excitation device is disposed above a dielectric wall 8 that closes the top of the chamber 3 of the dry etching apparatus 1. The upper electrode 9 is electrically connected to a first high-frequency power source 10A. A stage 11 on which the transport carrier 4 holding the substrate 2 is loaded is disposed on the bottom side of the process chamber 5. The transport carrier 4 is loaded on the stage 11, having a posture in which the surface holding the substrate 2 faces the upper electrode 9.

The stage 11 includes an electrode section 15 and a base 16 that holds the electrode section 15. An exterior case 17 surrounds a periphery of the electrode section 15 and the base 16. The electrode section 15 is configured to have a thin dielectric section 15b having a loading surface 18 of the transport carrier 4 and a metallic section 15c having a coolant flow path 15a. The coolant flow path 15a communicates with a coolant circulation system 21 that performs circulation of coolant having a controlled temperature in the coolant flow path 15a. The coolant flow path 15a and the coolant circulation system 21 constitute a cooling mechanism for cooling the stage 11.

Figure 2:
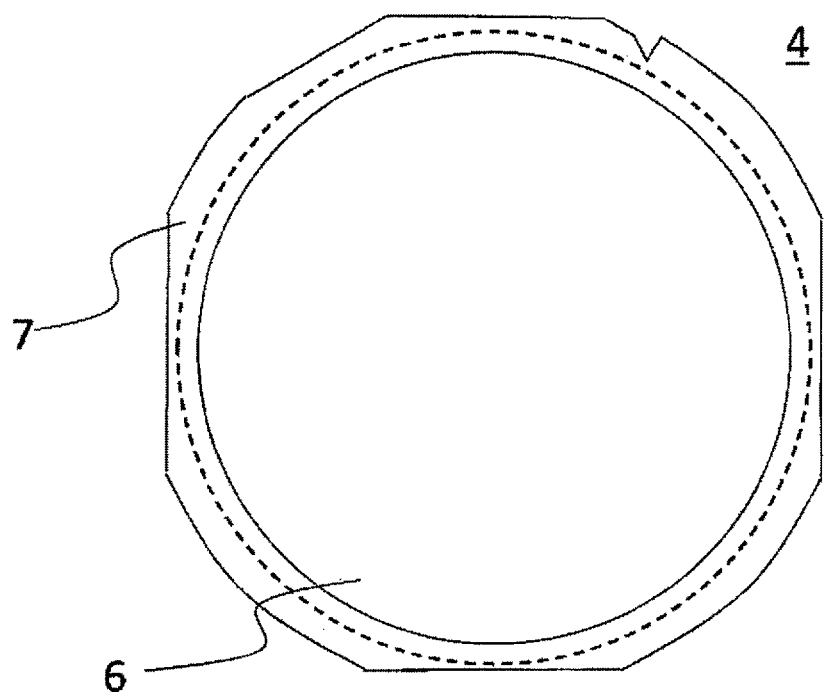
FIG. 2 is a top view of a transport carrier.
Figure 3:
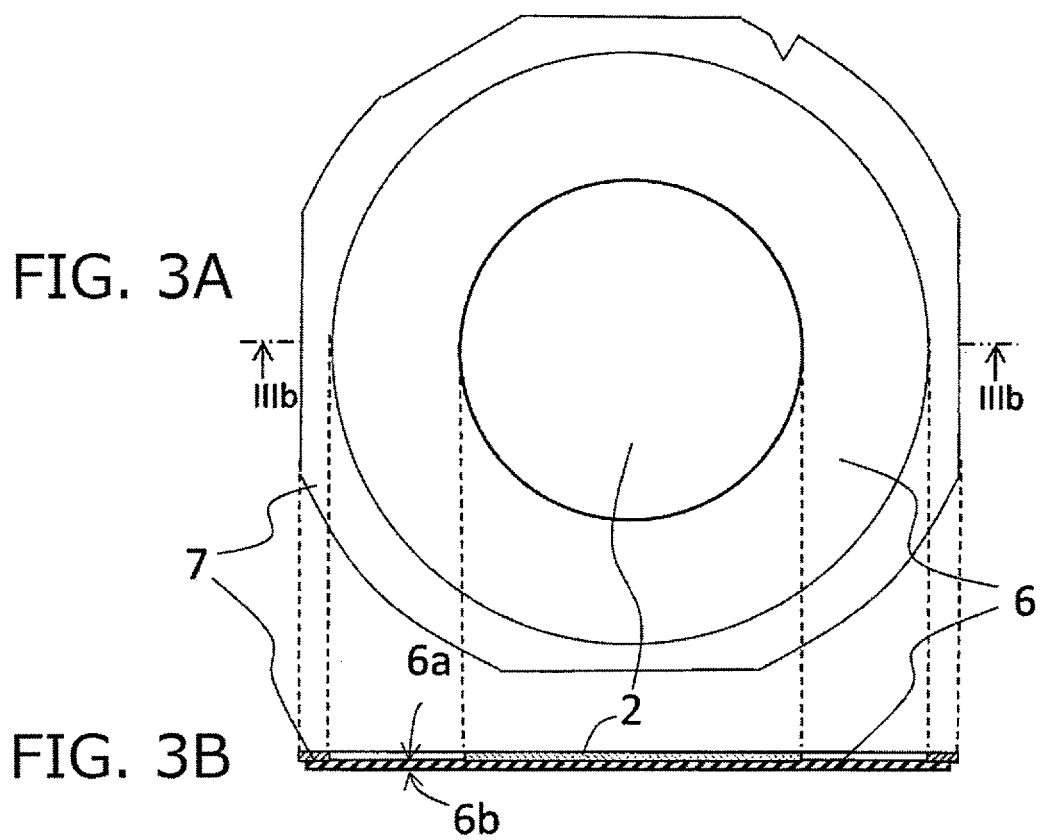
FIG. 3A is a top view of the transport carrier that holds a substrate and FIG. 3B is a sectional view taken along line IIIB-IIIB in FIG. 3A.

FIG. 2 is a top view of an example of the transport carrier. The transport carrier 4 includes the elastically extensible holding sheet 6 and the frame 7 having rigidity. FIG. 3A is a top view of the transport carrier 4 that holds the substrate 2 and FIG. 3B is a sectional view taken along line IIIB-IIIB in FIG. 3A. The holding sheet 6 has a surface (adhesive surface 6a) with an adhesive and a surface (non-adhesive surface 6b) without an adhesive.

The frame 7 has an opening with an area which is equal to or greater than that of the substrate 2 as a target object of the plasma processing and is substantially uniformly thin. There is no limitation on the shape of the opening of the frame 7 and the shape may be a circle or may be a polygon such as a rectangle or a hexagon. A notch or a corner cut for positioning may be provided on the frame 7. Examples of a material of the frame 7 include metal such as aluminum or stainless steel, a resin, and the like. It is preferable that the frame 7 has an inner diameter greater than an inner diameter of the cover 24 to be described below and has the maximum outer diameter smaller than an outer diameter of the cover 24.

The holding sheet 6 has an area which is slightly less than an area within an exterior outline of the frame 7. A circumferential edge section of one surface of the holding sheet 6 is bonded to one surface of the frame 7. There is no need to bond the holding sheet all over the entire width of the frame 7 and, for example, the holding sheet may be bonded in a region having a width of about 10 mm from the inner side of the frame 7. In this manner, the holding sheet 6 is fixed to the frame 7 to cover the opening of the frame 7. The holding sheet 6 can be configured of, for example, a UV curing type acrylic adhesive (adhesive surface 6a) and a base material (non-adhesive surface 6b) of polyolefin. It is preferable that the adhesive contains a component which loses an adhesive force through ultraviolet irradiation. In this manner, the ultraviolet irradiation is performed after dicing and thereby, individualized substrates (chips) are likely to be peeled off from the adhesive surface 6a.

The substrate 2 is bonded to the adhesive surface 6a of the holding sheet 6 to be positioned in the opening of the frame 7. Since the holding sheet 6 is flexible, it is difficult to stably transport the individualized substrate 2 (chip) through dicing only by bonding the substrate 2 to the holding sheet 6. The holding sheet 6 to which the substrate 2 is bonded is fixed to the frame 7 having rigidity and thereby, it is easy to transport the substrate 2 even after the dicing is performed. The center of the substrate 2 is disposed at the center of the opening of the frame 7 and thereby, an annular region of the adhesive surface 6a, through which exposure occurs with a certain width, is formed between the substrate 2 and the frame 7. When the plasma processing is performed, the annular region corresponds to a region that is covered by the cover 24 to be described below.

There is no particular limitation on the substrate 2 as a target object of the plasma process. Examples of a material of the substrate 2 include single crystal Si, $SiO_2$, SiC, and the like. There is no particular limitation on the shape of the substrate 2 and, for example, the shape is a circle or a polygon. In addition, there is no particular limitation on the size of the substrate 2 and, for example, the maximum diameter is about 50 mm to 300 mm. A cut such as an orientation flat or a notch may be provided on the substrate 2.

A resist mask (not shown) having a desirable shape is formed on the surface of the substrate 2, to which the holding sheet 6 is not bonded. A portion in which the resist mask is formed is protected from etching by plasma. A portion in which the resist mask is not formed is etched by plasma from the surface thereof to the back surface.

When the plasma processing is performed, the cover 24 is provided above the stage 11 in the process chamber 5 and covers a part (annular region) of the holding sheet 6 and the frame 7 of the transport carrier 4 loaded on the stage 11. The exterior outline of the cover 24 is circular and it is preferable that the exterior outline is formed to be sufficiently greater than the exterior outline of the transport carrier 4. The cover 24 has a donut-shaped roof section 24a and a cylindrical circumferential side section 24b that extends from the circumferential edge of the roof section 24a to a side of the stage 11 with a bent portion interposed therebetween. In addition, the cover 24 has a circular window section 25 at the center of the roof section 24a. During the plasma process, the roof section 24a covers a part of the holding sheet 6 and at least a part of the frame 7 and at least a part of the substrate 2 is exposed to the plasma through the window section 25. A tapered recessed portion in which an elevation is gradually lowered toward the center is formed around the window section 25 of the roof section 24a. Examples of a material of the cover 24 include ceramics such as quartz or alumina, aluminum with which an alumite process is performed on the surface thereof, and the like. The cover 24 is provided to cover the entire annular region of the holding sheet 6 and the entire frame 7, which is desirable in that the holding sheet and the flame are blocked from the plasma. Here, there may be a region which is not covered by the cover 24, on a part of the annular region of the holding sheet 6 and a part of the frame 7. In this case, it is preferable that 50% or more of the area of the annular region of the holding sheet 6 is covered by the cover 24. In addition, it is preferable that 50% or more of the area of the top surface (surface on the side facing the cover 24) of the frame 7 is covered by the cover 24.

Figure 4:
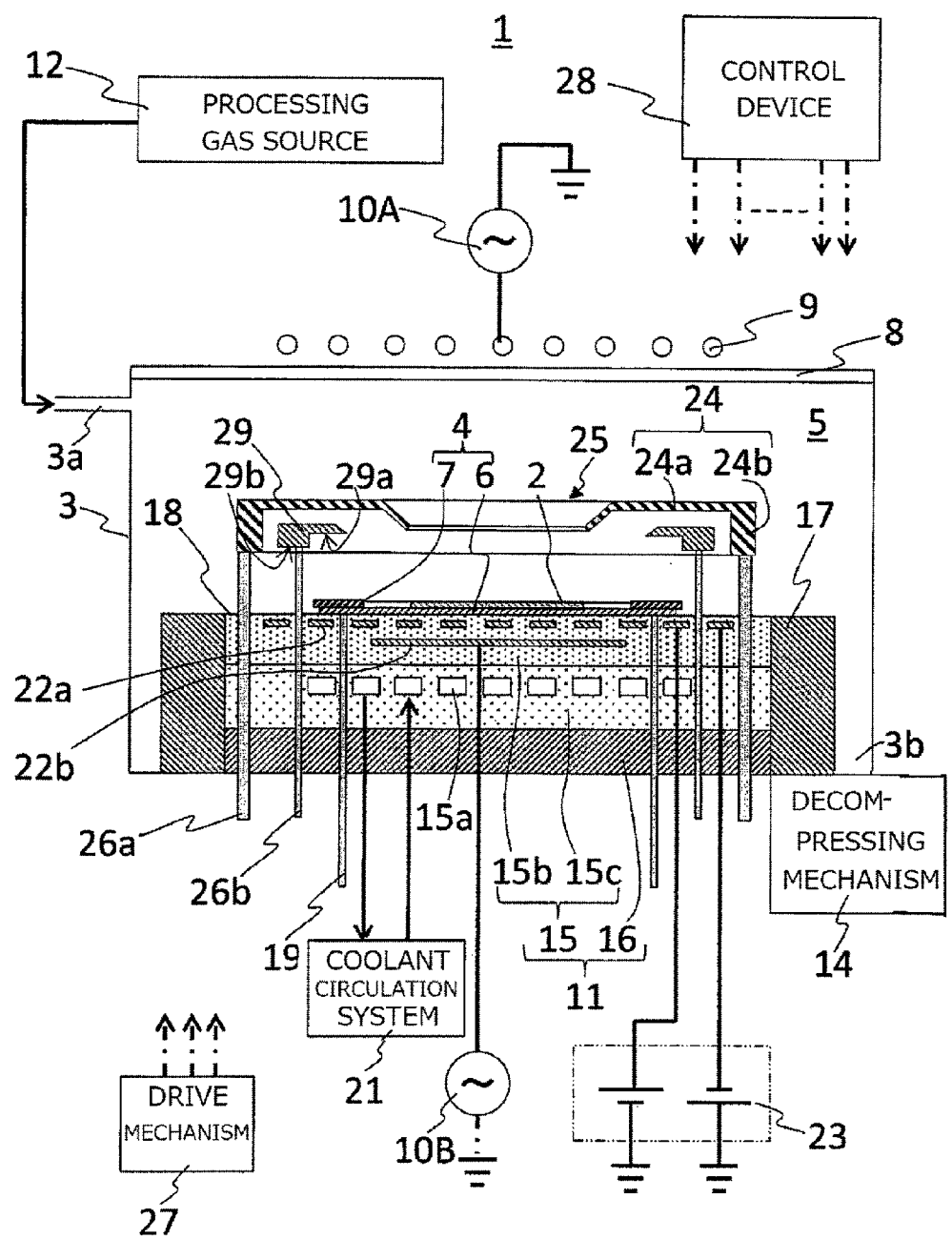
FIG. 4 is a sectional view showing a second state of the plasma processing apparatus according to the first embodiment.

When the cover 24 covers a part of the holding sheet 6 and the frame 7, the lower end section of the circumferential side section 24b of the cover 24 is caused to come into contact with the stage 11. The lower end section of the circumferential side section 24b is connected to the top portions of one or more first lifting rods 26a that penetrate the stage 11 and can be lifted and lowered. The first lifting rods 26a are driven to be lifted and lowered by a predetermined drive mechanism and the cover 24 is lifted and lowered along with the first lifting rods 26a. Specifically, the cover 24 can move to a lowered position at which a part of the holding sheet 6 and the frame 7 of the transport carrier 4 are covered and to a lifted position at which the transport carrier 4 is conveyed into or out from the process chamber. FIG. 4 shows a state of the plasma processing apparatus with the cover 24 at the lifted position. It is desirable that the cover 24 does not come into direct contact with either the transport carrier 4 or the substrate 2 at the lowered position. This is because it is preferable that heat of the cover 24 heated by the plasma is not transferred to the transport carrier 4 and the substrate 2.

A correction member 29 is provided at a position above the stage 11 to be covered by the cover 24 and presses the frame 7 of the transport carrier 4 loaded on the stage 11 onto the stage 11 and corrects warpage of the frame. The correction member 29 is provided separately from the cover 24 to be covered by the cover 24. There is no particular limitation on the shape or the material of the correction member 29.

The correction member 29 is connected to the top portions of one or more second lifting rods 26b that penetrate the stage 11. The second lifting rods 26b are driven to be lifted and lowered by a drive mechanism 27 conceptually shown in FIG. 1 and the correction member 29 is lifted and lowered along with the second lifting rods 26b. That is, the second lifting rods 26b and the drive mechanism 27 function as movement devices that cause the correction member 29 to move to a position relatively to the frame 7. The correction member 29 can move to a lowered position at which the frame 7 is pressed onto the stage 11 and to a lifted position at which the transport carrier 4 is conveyed into or out from the process chamber. FIG. 4 shows a state of the plasma processing apparatus with the correction member 29 at the lifted position.

The correction member 29 presses the frame 7 onto the stage 11 at the lowered position. In this manner, even in a case where the frame 7 has warpage, the warpage is corrected and a gap due to the warpage is not formed between the frame 7 and the stage 11. That is, the warpage correction of the frame 7 makes it possible for the frame 7 to come into reliable contact with the loading surface 18 with the holding sheet 6 interposed. In addition, the warpage correction of the frame 7 makes it possible to suppress detaching of the holding sheet 6 bonded to the frame 7 from the loading surface 18 and makes it possible for the holding sheet 6 to come into reliable contact with the loading surface 18. Accordingly, it is possible to prevent abnormal discharge due to the warpage of the frame 7 and insufficient cooling of the transport carrier 4. The correction member 29 is provided separately from the cover 24 and the movement thereof is controlled by the provided second lifting rods 26b and drive mechanism 27. Accordingly, it is possible to reliably apply a mechanical force to the frame 7 onto the stage 11 and it is easy to correct the warpage of the frame 7.

When the correction member 29 presses the frame 7 onto the stage 11, as shown in FIG. 1, the correction member 29 may be formed not to come into contact with the cover 24 such that the cover 24 and the correction member 29 have a noncontact state. The cover 24 and the correction member 29 are positioned apart from each other and thereby, heat from the roof section of the cover 24 which is exposed to the plasma is unlikely to be transferred to the correction member 29. Accordingly, a significant effect of preventing the insufficient cooling of the transport carrier 4 is achieved.

It is preferable that the correction member 29 is caused to come into contact with the stage 11 having the cooling mechanism at the lowered position. In this manner, it is possible to cool the correction member 29 by the stage 11. Accordingly, the frame 7 pressed onto the stage 11 by the correction member 29 is cooled by both the correction member 29 and the stage 11 and thus, a more significant effect of preventing the insufficient cooling of the transport carrier 4 is achieved.

Specifically, as shown in FIG. 1, when the correction member 29 presses the frame 7 onto the stage 11, it is preferable that the correction member 29 has the first contact surface 29a that comes into contact with the frame 7 and the second contact surface 29b that comes into contact with the stage 11. The first contact surface 29a comes into direct contact with the frame 7 and the second contact surface 29b comes into direct contact with the loading surface 18 of the stage 11. Accordingly, a significant effect of losing heat from the frame 7 through the correction member 29 to the stage 11 is achieved.

At this time, it is preferable that thermal conductivity of the correction member 29 is greater than thermal conductivity of the cover 24. In this manner, heat exchange between the stage 11 and the correction member 29 and heat exchange between the correction member 29 and frame 7 are performed at a high rate. When high thermal conductivity is taken into account, it is preferable that examples of a material of the correction member 29 include metal such as aluminum, an aluminum alloy, or stainless steel, aluminum on which an alumite process is performed, and the like.

The first lifting rods 26a and the second lifting rods 26b may be driven to be lifted and lowered by the common drive mechanism 27. For example, the first lifting rods 26a and the second lifting rods 26b may be connected below the stage 11 and may be lifted and lowered at the same time. There is no particular limitation on the drive mechanism that lifts and lowers the first lifting rods 26a and the second lifting rods 26b.

Hereinafter, a state in which the cover 24 and the correction member 29 of the dry etching apparatus 1 are disposed at the lowered positions, respectively, is referred to as a first state and a state of being disposed at the lifted positions, respectively, is referred to as a second state.

Figure 5:
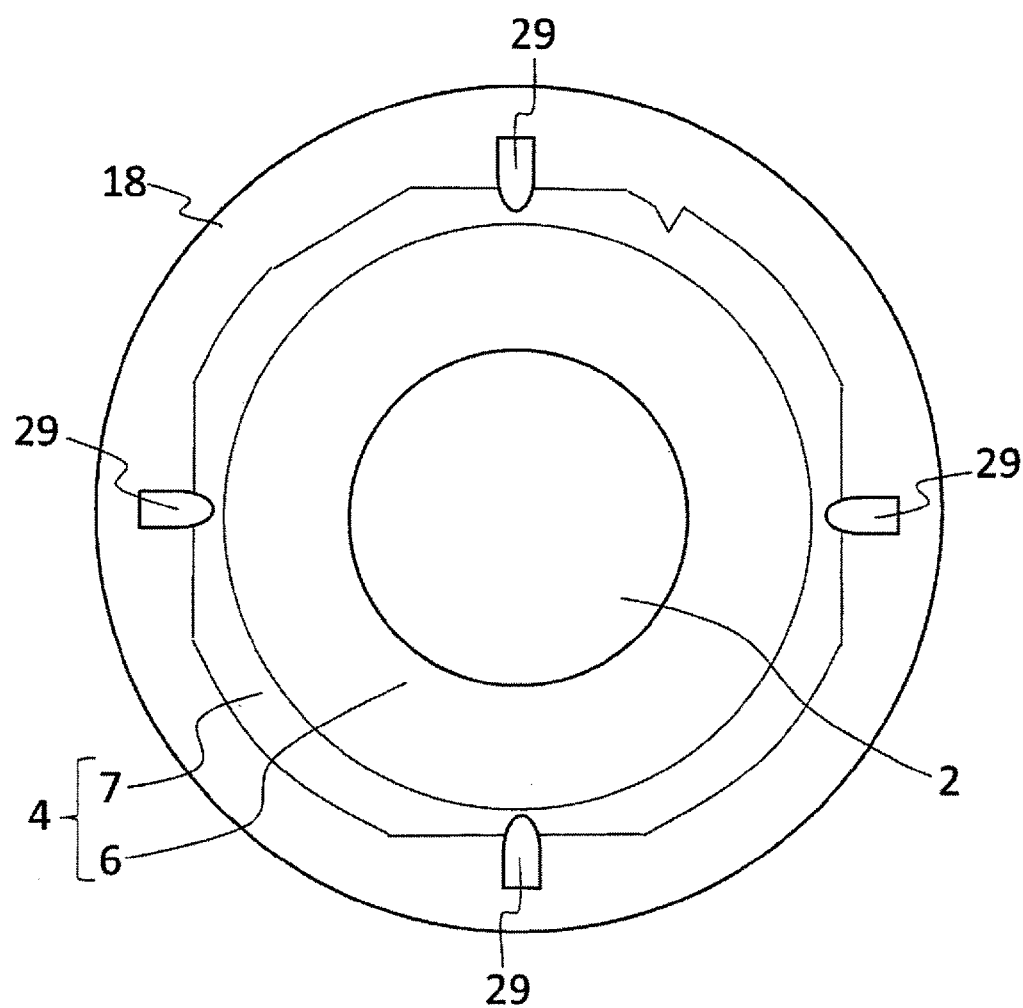
FIG. 5 is a top view showing a positional relationship between the transport carrier loaded on the stage and a correction member.

FIG. 5 is a top view showing a positional relationship between the transport carrier 4 loaded on the stage 11 and the correction member 29. FIG. 5 shows a state in which the dry etching apparatus 1, which is in the first state as shown in FIG. 1, is viewed through the cover 24 from the upper section in the process chamber 5. The transport carrier 4 holding the substrate 2 is loaded on the stage 11 and a plurality of correction members 29 press the frame 7 onto the stage 11 at the lowered position. There is no particular limitation on the shape and number of the correction members 29. When a sufficient effect of warpage correction of the frame 7 is taken into account, it is desirable that a plurality of (for example, four or more) positions symmetrical with the center of the opening of the frame 7 are pressed onto the stage 11 by the corresponding number of (for example, four or more) correction members 29. In addition, a plurality of (for example, three or more) positions of the frame 7 at an equal interval along the opening of the frame 7 may be pressed by the corresponding number of (for example, three or more) correction members 29.

The conveyance of the transport carrier 4 into and out from the process chamber 5 is performed in cooperation with a plurality of frame lifting pins 19 that penetrate the stage 11 and a transport arm (not shown). Specifically, the frame lifting pins 19 can move to the lowered position (accommodation position) at which the dry etching apparatus 1 has the first state and to the lifted position at which sending out and receiving in of the transport carrier 4 are performed. The frame lifting pins 19 are driven to be lifted and lowered by a predetermined drive mechanism. The transport carrier 4 is lifted and lowered along with the frame lifting pins 19. When the frame lifting pins 19 are lowered, an operation of loading the transport carrier 4 on the stage 11 is performed.

As shown in FIG. 1, it is preferable that electrostatic chucking electrodes 22a are accommodated in the vicinity of the loading surface 18 of the dielectric section 15b. The electrostatic chucking electrodes 22a are electrically connected to a DC power source 23. In this manner, the loading surface 18 of the transport carrier 4 functions as an electrostatic chuck. The electrostatic chucking electrodes 22a may be bipolar type or single polar type.

A lower electrode 22b that is electrically connected to a second high-frequency power source 10B is disposed below the electrostatic chucking electrodes 22a. A bias voltage is applied to the lower electrode 22b from the second high-frequency power source 10B and thereby, energy generated when ions in the plasma are incident to the substrate 2 is controlled.

Operations of the respective components of the dry etching apparatus 1 are controlled by a control device 28 conceptually shown in FIG. 1. Here, the components of the dry etching apparatus 1 include the first and second high-frequency power sources 10A and 10B, the processing gas source 12, the decompressing mechanism 14, the coolant circulation system 21, the DC power source 23, and the drive mechanism 27. That is, the drive mechanism 27 controls each operation of the second lifting rod 26b in response to an instruction from the control device 28. Each operation of the frame lifting pin 19 is controlled by a predetermined drive mechanism in response to an instruction from the control device 28. Each operation of the first lifting rod 26a is controlled by a predetermined drive mechanism or the drive mechanism 27 in response to an instruction from the control device 28.

Next, each process for performing the plasma processing on the substrate 2 held on the transport carrier 4 will be exemplarily described. Here, a case where the first lifting rods 26a and the second lifting rods 26b are separately lifted and lowered by the drive mechanisms.

First, the transport carrier 4 holding the substrate 2 is conveyed into the process chamber 5 of the dry etching apparatus 1 having the second state, by a transport mechanism (not shown). At this time, the transport carrier 4 is delivered to the frame lifting pins 19 which are disposed at the lifted position. Next, the frame lifting pins 19 are lowered and the transport carrier 4 is loaded on the loading surface 18 of the stage 11. At this time, the cover 24 and the correction member 29 are disposed at the lifted position.

Next, the second lifting rods 26b are caused to move from the lifted position to the lowered position by the drive mechanism 27 and the frame 7 of the transport carrier 4 loaded on the stage 11 is pressed onto the stage 11 by the correction member 29. In this manner, the warpage of the frame 7 is corrected such that a gap due to the warpage is not formed between the frame 7 and the loading surface 18 of the stage 11. The warpage correction of the frame 7 makes it possible for the frame 7 to come into reliable contact with the loading surface 18 with the holding sheet 6 interposed. In addition, the warpage correction of the frame 7 makes it possible to suppress detaching of the holding sheet 6 bonded to the frame 7 from the loading surface 18 and makes it possible for the holding sheet 6 to come into reliable contact with the loading surface 18.

In a case where the electrostatic chucking electrodes 22a are accommodated in the vicinity of the loading surface 18 of the dielectric section 15b of the stage 11, a DC voltage is applied to the electrostatic chucking electrodes 22a from the DC power source 23. Since the frame 7 is in reliable contact with the loading surface 18 with the holding sheet 6 interposed in a state in which the warpage is corrected, the frame 7 and the loading surface 18 can be reliably adsorbed electrostatically by the voltage applying and the frame 7 can be cooled. Similarly, since the holding sheet 6 is in reliable contact with the loading surface 18 in a state in which the detaching from the loading surface 18 is suppressed, the holding sheet 6 and the substrate 2 bonded thereto and the loading surface 18 can be reliably adsorbed electrostatically by the voltage applying and the holding sheet 6 and the substrate 2 can be cooled.

Subsequently, the first lifting rods 26a are caused to move from the lifted position to the lowered position and thereby, a part of the holding sheet 6 and the frame 7 of the transport carrier 4 are covered by the cover 24. At this time, the correction member 29 is also covered by the cover 24. The substrate 2 is exposed through the window section 25 of the cover 24. In this manner, the dry etching apparatus 1 achieves the first state.

Next, plasma is caused to be generated in the process chamber 5 of the chamber 3 and the plasma processing is performed on the substrate 2 that is exposed through the window section 25 of the cover 24. Specifically, while a process gas for plasma dicing is guided into the process chamber 5 from the processing gas source 12, air emission from the process chamber 5 is performed by the decompressing mechanism 14 and the process chamber 5 is maintained to have a predetermined pressure. Then, high-frequency power is supplied to the upper electrode (antenna) 9 from the first high-frequency power source 10A such that plasma is caused to be generated in the process chamber 5 and the substrate 2 is irradiated with the plasma. At this time, a bias voltage is applied to the electrode section 15 of the stage 11 from the second high-frequency power source 10B.

The portion (street) that is exposed through the resist mask of the substrate 2 is removed from the surface to the back surface by physicochemical effects of radicals and ions in the plasma and the substrate 2 is individualized into a plurality of chips.

After the plasma dicing is completed, ashing is performed. While a process gas (for example, oxygen gas) for ashing is guided into the process chamber 5 from an ashing gas source (not shown), air emission from the process chamber 5 is performed by the decompressing mechanism 14 and the process chamber 5 is maintained to have the predetermined pressure. Then, high-frequency power is supplied to the upper electrode (antenna) 9 from the first high-frequency power source 10A such that plasma is caused to be generated in the chamber 3 and the substrate 2 is irradiated with the plasma. Oxygen plasma irradiation causes the resist mask to be removed from the surface of the substrate 2. After ashing process is completed, the transport carrier 4 is conveyed out from the process chamber 5 by the transport mechanism.

The plasma processing that is performed in the dry etching apparatus 1 is not limited to the plasma dicing, the ashing, or the like, and the plasma processing may be the common dry etching. In addition, the dry etching apparatus is not limited to an ICP type as in the embodiment described above, and may be a parallel plate type. Further, the plasma processing apparatus of the present invention is not limited to the dry etching apparatus and can also be applied to another plasma processing apparatus such as a CVD apparatus.

The electrostatic chucking electrode that functions as an electrostatic chuck is not necessarily provided. In a case where the frame contains a semiconductor material and/or a conductive material, it is desirable that the electrostatic chucking electrode is provided in the vicinity of the loading surface 18 of the dielectric section 15b. In this manner, even in a case where the correction member 29 applies weak pressure, the electrostatic chucking electrode causes an electrostatic attractive force to be applied to the frame and the frame is likely to come into close contact with the stage. Once the frame 7 is pressed onto the stage 11 by the correction member 29, a gap is unlikely to be formed between the frame 7 and the stage 11 due to the electrostatic chuck even when the correction member 29 even stops pressing.

In the embodiments described above, the case in which the cover 24 is movable with respect to the stage 11 is described as an example. However, for example, a case in which the cover 24 is fixed to a side wall of the chamber 3 and the stage 11 is movable with respect to the cover 24 is included in the scope of the present invention. Similarly, for example, the correction member 29 may be fixed to the side wall of the chamber 3. In this case, the stage 11 may be movable with respect to the correction member 29.

Second Embodiment

Figure 6:
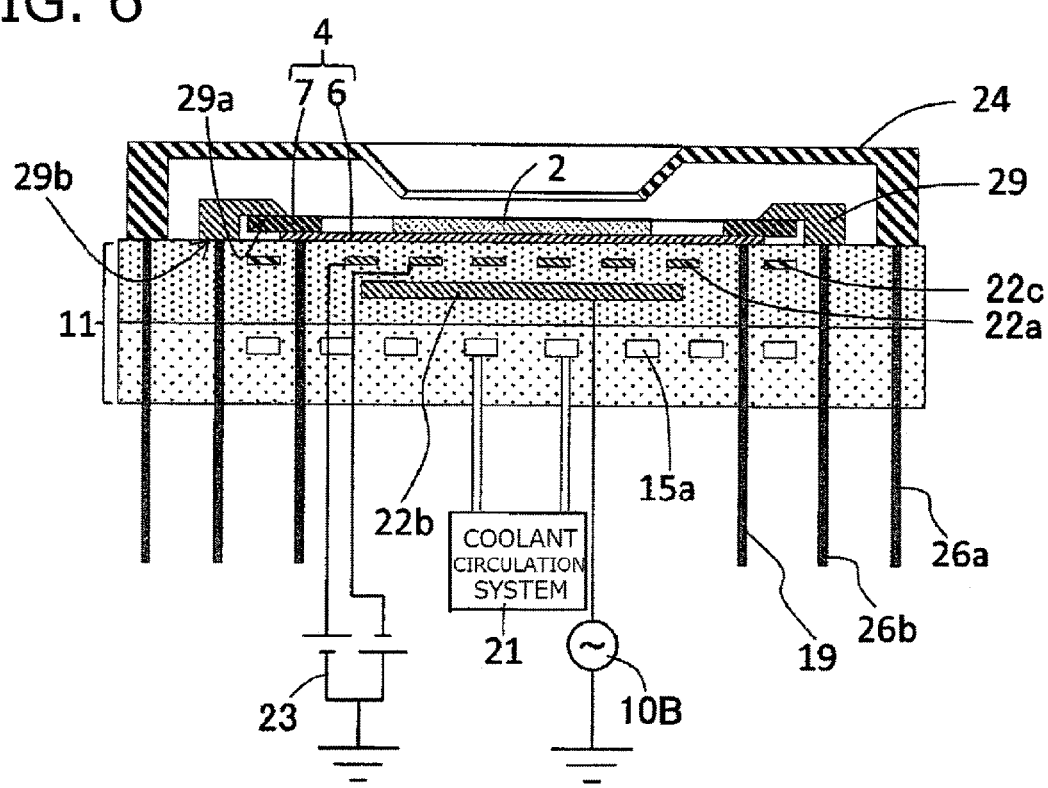
FIG. 6 is an enlarged sectional view showing main components in a first state of a plasma processing apparatus according to a second embodiment.

FIG. 6 is a sectional view conceptually showing a structure of main components of a plasma processing apparatus according to a second embodiment of the present invention.

The present embodiment is different from the first embodiment in that a magnetic force source 22c is disposed in the stage. As the magnetic force source 22c, for example, an electromagnet, a permanent magnet, or the like can be used. Accordingly, in a case where the frame 7 contains a magnetic material, a magnetic force is caused to be applied to the frame 7 by the magnetic force source 22c, the frame 7 is attracted to the electrode section 15 of the stage 11 by the magnetic force, and close contact therebetween can be achieved. In this manner, a more stable process can be achieved. When this effect is taken into account, it is preferable that the magnetic force source 22c is disposed to face the frame 7 in the vicinity of the loading surface 18 of the dielectric section 15b of the electrode section 15 of the stage 11. Examples of the magnetic material include iron, nickel, and the like.

Third Embodiment

Figure 7:
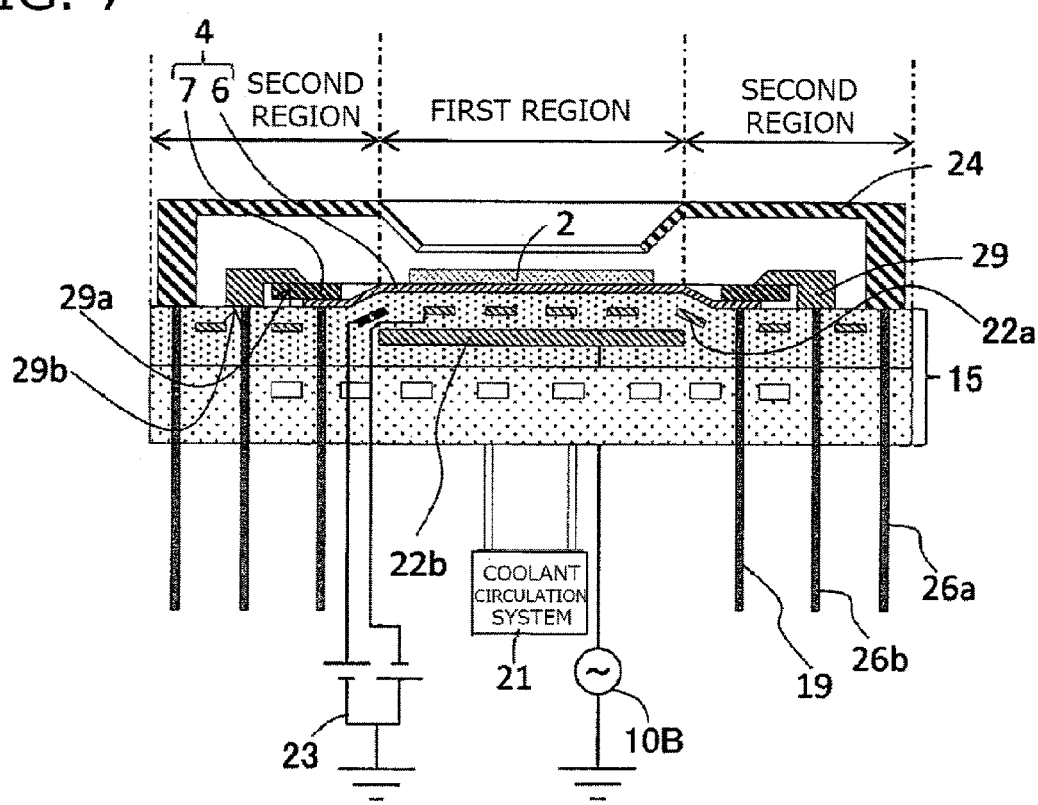
FIG. 7 is an enlarged sectional view showing main components in a first state of a plasma processing apparatus according to a third embodiment.

FIG. 7 is a sectional view conceptually showing a structure of main components of a plasma processing apparatus according to a third embodiment of the present invention.

The present embodiment is different from the first embodiment in that a surface that comes into contact with the transport carrier 4 of the stage 11 has a flat first region which faces the substrate 2 held on the transport carrier 4 and a second region that is provided to surround the first region and has an elevation lower than the first region. When the correction member 29 presses the frame 7 onto the electrode section 15 of the stage 11, the frame 7 faces the second region. In this manner, an appropriate tensile force is applied to the holding sheet 6 and the substrate 2 comes into contact with the first region with high adhesiveness. Accordingly, the stability of the process is further enhanced. A difference between the elevations of the first region and the second region is, for example, preferably 0.5 mm or more and more preferably 1 mm or more. However, when the difference between the elevations becomes greater, a load on the holding sheet 6 becomes heavier. Thus, it is preferable that the difference between the elevations is 5 mm or less.

Fourth Embodiment

Figure 8:
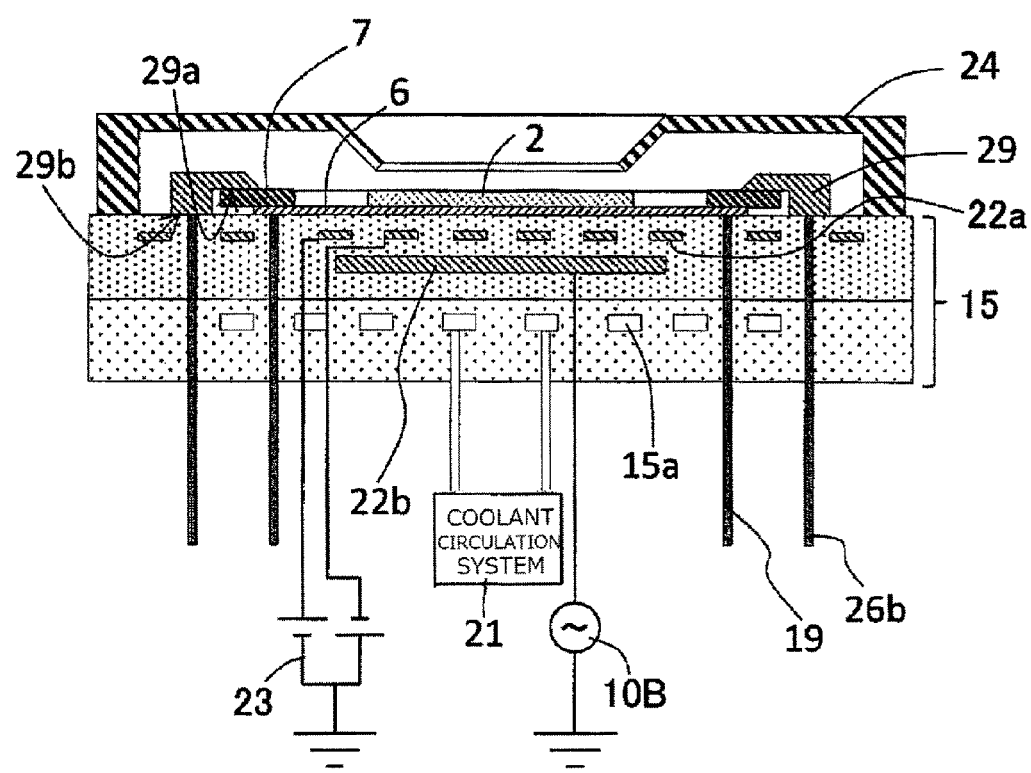
FIG. 8 is an enlarged sectional view showing main components in a first state of a plasma processing apparatus according to a fourth embodiment.

FIG. 8 is a sectional view conceptually showing a structure of main components of a plasma processing apparatus according to a fourth embodiment of the present invention.

Figure 9:
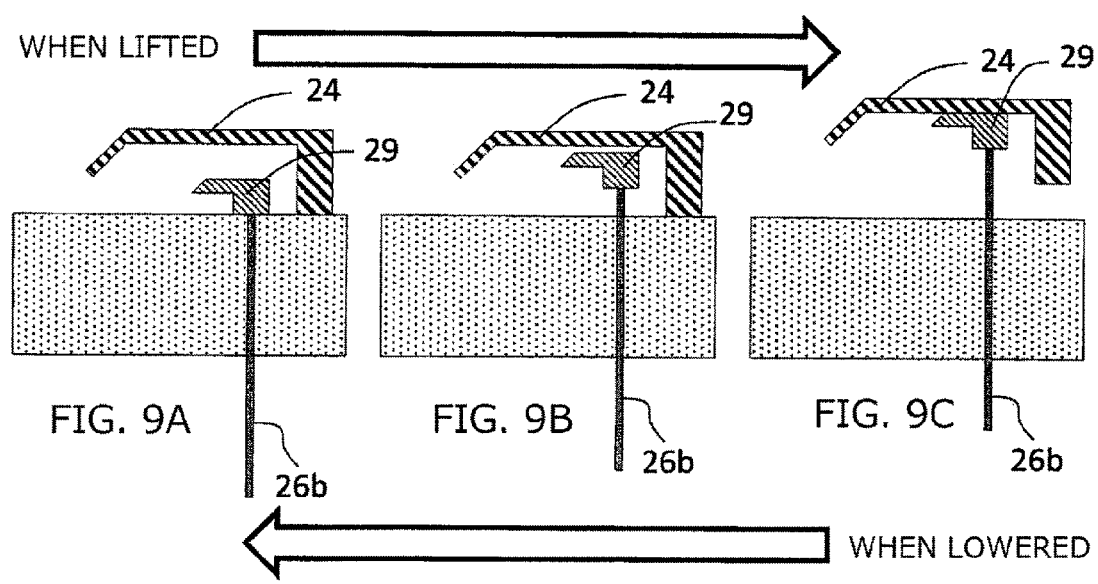
FIGS. 9A to 9C are explanatory views showing a lifting/lowering operation of a correction member and a cover of the plasma processing apparatus according to the fourth embodiment.

The present embodiment is different from the first embodiment in that the first lifting rod that is connected to the lower end portion of the circumferential edge section of the cover 24 is not provided. Even in a case where the first lifting rod is not provided, as conceptually shown in FIGS. 9A to 9C, the cover 24 can be caused to be lifted and lowered along with the correction member 29 due to the second lifting rods 26b. Specifically, when the cover 24 is lifted, the second lifting rod 26b is lifted in the order from FIG. 9A to FIG. 9C and the cover 24 is pushed up by the top portion of the correction member 29. Conversely, when the cover 24 is lowered, the second lifting rod 26b is lowered in the order from FIG. 9C to FIG. 9A. In this manner, the first lifting rods 26a are omitted and thereby, a configuration of the apparatus can be simplified and manufacturing costs can be decreased.

Fifth Embodiment

Figure 10:
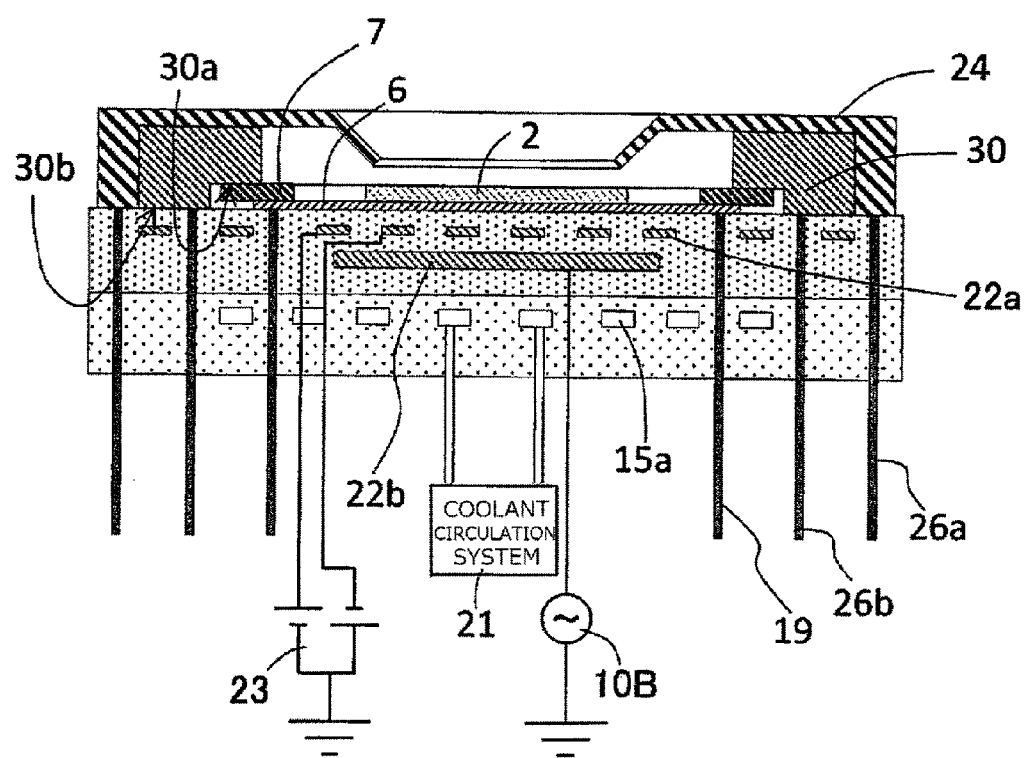
FIG. 10 is an enlarged sectional view showing main components of a plasma processing apparatus according to a fifth embodiment.

FIG. 10 is a sectional view conceptually showing a structure of main components of a plasma processing apparatus according to a fifth embodiment of the present invention.

The present embodiment is different from the first embodiment in that, when in the first state, that is, when a correction member 30 presses the frame 7 onto the electrode section 15 of the stage 11, the cover 24 comes into contact with the correction member 30. The correction member 30 comes into direct contact with the stage 11 and thereby, the correction member 30 is cooled. In this manner, it is possible to cool the cover 24 due to the correction member 30. The cooling of the cover 24 makes it possible to suppress radiation heat that radiates from the cover 24 to the holding sheet 6 and the frame 7. Accordingly, a significant effect of cooling the transport carrier 4 is achieved. There is no particular limitation on the cover 24 which is caused to come into contact with the correction member 30 but it is preferable that both the roof section and the circumferential side section of the cover 24 come into contact with the correction member 30.

In a case where the cover 24 is allowed to come into contact with the correction member 30, it is possible to increase a volume of the correction member 30. In this manner, thermal capacity of the correction member 30 becomes greater and thus, areas of a first contact portion 30a that comes into contact with the frame 7 and of a second contact portion 30b that comes into contact with the electrode section 15 of the stage 11 become greater. Accordingly, even when the correction member 30 is in contact with the cover 24, heat exchange between the frame 7 and the stage 11 through the correction member 30 is efficiently performed. In addition, the area of the first contact portion 30a that comes into contact with the frame 7 becomes greater and thereby, the frame 7 is pressed onto the stage 11 with a stable force. When the effect described above is taken into account, as described above, it is effective to have the thermal conductivity of the correction member 30 to be greater than the transport carrier of the cover 24. Here, it is preferable that examples of the material of the correction member 30 include metal such as aluminum, an aluminum alloy, or stainless steel, aluminum on which alumite process is performed, and the like.

Sixth Embodiment

Figure 11:
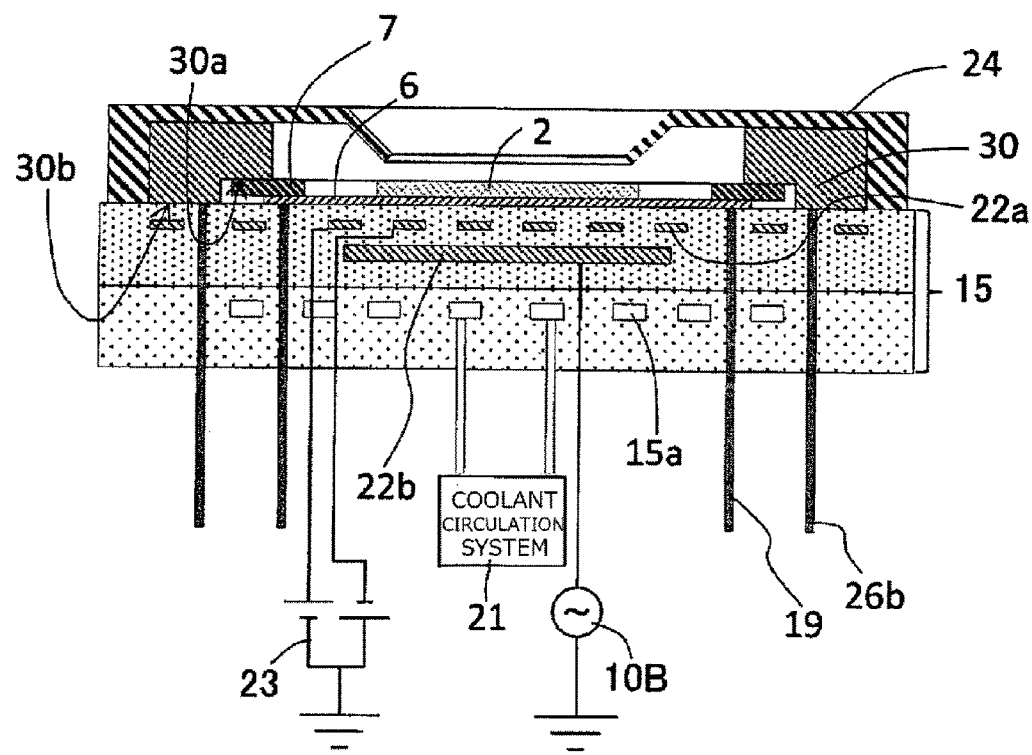
FIG. 11 is an enlarged sectional view showing main components of a plasma processing apparatus according to a sixth embodiment.

FIG. 11 is a sectional view conceptually showing a structure of main components of a plasma processing apparatus according to a sixth embodiment of the present invention.

The present embodiment is different from the fifth embodiment in that the first lifting rod 26a that is connected to the circumferential edge section of the cover 24 is not provided. Accordingly, advantages of the present embodiment compared to the fifth embodiment are the same as the advantages of the fourth embodiment compared to the first embodiment.

In a plasma processing apparatus and a processing method of the present invention, a substrate held on a transport carrier is used in plasma processing such that it is possible to stably perform various types of etching in addition to plasma dicing without being influenced by a state of the transport carrier.

What is claimed is:

1. A plasma processing method of performing plasma processing on a substrate held on a transport carrier that has an annular frame and a holding sheet, the plasma processing method comprising:

(i) conveying the transport carrier holding the substrate into a chamber provided in a plasma processing apparatus and loading the transport carrier on the stage that is equipped with a cooling mechanism and provided in the chamber;
(ii) covering a part of the holding sheet and at least a part of the frame of the transport carrier loaded on the stage, with a cover that has a window section through which at least a part of the substrate is exposed to plasma;
(iii) pressing the frame of the transport carrier loaded on the stage onto the stage by a correction member that is provided separately from the cover to be covered by the cover and correcting warpage of the frame by the correction member; and
(iv) generating plasma in the chamber and performing the plasma processing on the substrate through the window section.

2. The plasma processing method according to claim 1, wherein
when the correction member presses the frame onto the stage, the cover and the correction member are in a non-contact state.

3. The plasma processing method according to claim 1, wherein
the correction member has a first contact portion that comes into contact with the frame and a second contact portion that comes into contact with the stage when the correction member presses the frame onto the stage.

4. The plasma processing method according to claim 3, wherein
the correction member has thermal conductivity greater than thermal conductivity of the cover.

5. The plasma processing method according to claim 1, wherein
an electrostatic chucking electrode provided within the stage exerts an electrostatic force to the frame to cause the frame to be in close contact with the stage when the correction member presses the frame onto the stage.

6. The plasma processing method according to claim 1, wherein
a magnetic force source provided within the stage exerts a magnetic force to the frame to cause the frame which contains a magnetic material to be in close contact with the stage when the correction member presses the frame onto the stage.

7. The plasma processing method according to claim 1, wherein
a surface of the stage, which comes into contact with the transport carrier, has a flat first region facing the substrate held on the transport carrier and a second region that is provided to surround the first region at an elevation lower than the first region, and
when the correction member presses the frame onto the stage, the frame of the transport carrier faces the second region.

8. The plasma processing method according to claim 1, wherein
the cover has a tapered recessed portion around the window section in which an elevation is gradually lowered toward the window section.

9. The plasma processing method according to claim 1, wherein
during the performing of the plasma processing, ashing is performed after plasma dicing is completed.

* * * * *